(12) United States Patent
Jayaraman et al.

(10) Patent No.: US 7,983,363 B2
(45) Date of Patent: Jul. 19, 2011

(54) RECEIVER FOR THE GEOSYNCHRONOUS (GEO) SATELLITE REVERSE LINK USING TAIL-BITING CODE

(75) Inventors: Srikant Jayaraman, San Diego, CA (US); June Namgoong, Chula Vista, CA (US)

(73) Assignee: QUALCOMM Incorporated, San Diego, CA (US)

( * ) Notice: Subject to any disclaimer, the term of this patent is extended or adjusted under 35 U.S.C. 154(b) by 912 days.

(21) Appl. No.: 11/933,376

(22) Filed: Oct. 31, 2007

(65) Prior Publication Data

US 2008/0101506 A1    May 1, 2008

Related U.S. Application Data

(60) Provisional application No. 60/855,390, filed on Oct. 31, 2006.

(51) Int. Cl.
*H04L 27/06* (2006.01)
(52) U.S. Cl. .................. 375/341; 375/262; 714/786
(58) Field of Classification Search .......... 375/341, 375/262; 714/786
See application file for complete search history.

(56) References Cited

U.S. PATENT DOCUMENTS

| | | | |
|---|---|---|---|
| 6,320,919 B1 * | 11/2001 | Khayrallah et al. | 375/347 |
| 6,570,910 B1 * | 5/2003 | Bottomley et al. | 375/148 |
| 6,647,055 B2 | 11/2003 | Kuo | |
| 6,889,355 B1 * | 5/2005 | Calderbank et al. | 714/792 |
| 2004/0071193 A1 * | 4/2004 | Atarashi et al. | 375/144 |
| 2005/0111397 A1 * | 5/2005 | Attar et al. | 370/319 |

OTHER PUBLICATIONS

Nguyen, "Joint Space-Time Trellis Decoding and Channel Estimation in Correlated Fading Channels", IEEE 2004.*
Shankar, "Exact and Approximate Algorithms for ML Decoding on Tail-Biting Trellises", IEEE 2005.*
Piechocki, "Joint blind and semi-blind detection and channel estimation for space-time trellis coded systems", 2003 IEEE International Conference on Acoustics, Speech, and Signal Processing, 2003, Proceedings (ICASSP '03) vol. 4 Publication Year: 2003, pp. IV—349-52 vol. 4.*
Vilaipornsawai, "MAP-PSP for Joint Channel Estimation and Data Detection in Space-Time Coded Systems" IEEE 2005.*
Hong, "Per-Survivor Processing Sequence Detection for DS/CDMA Systems with Pilot and Traffic Channels", IEEE 2001.*
International Search Report, PCT/US07/083173, International Search Authority, European Patent Office, Jul. 18, 2008.
Written Opinion, PCT/US07/083173, International Search Authority, European Patent Office, Jul. 18, 2008.
Raheli et al., "Per-Survivor Processing," Digital Signal Processing, Jul. 1, 1993, pp. 175-187, vol. 3, No. 3, Academic Press, Orlando, FL, USA, XP000383220.
D'Andrea et al., "Approximate ML Decoding of Coded PSK with No Explicit Carrier Phase Reference," IEEE Transactions on Communications, Feb. 1, 1994, pp. 1033-1039, vol. 42, No. 2/03/04, IEEE Service Center, Piscataway, NJ, USA, XP000447352.
Fossorier et al., "Two Decoding Algorithms for Tailbiting Codes," IEEE Transactions on Communications, Oct. 1, 2003, pp. 1658-1665, vol. 51, No. 10, IEEE Service Center, Piscataway, NJ, USA, XP011102444.

* cited by examiner

*Primary Examiner* — Juan A Torres
(74) *Attorney, Agent, or Firm* — Jeffrey D. Jacobs (57) ABSTRACT

A receiver for the geosynchronous (GEO) satellite reverse link, which uses the tail-biting convolutional code for error control, and methods to solve the problem of channel estimation is described. The channel estimate is initialized at each state using the pilot channel. Branch metric computation is used for circular decoding of the tail-biting convolutional code. The technique is effective when partial tail-biting is implemented.

18 Claims, 5 Drawing Sheets

RECEIVER FOR THE GEOSYNCHRONOUS (GEO) SATELLITE REVERSE LINK USING TAIL-BITING CODE

RELATED APPLICATIONS

This application claims the benefit of U.S. Provisional Application No. 60/855,390 filed Oct. 31, 2006. The aforementioned provisional application's disclosure is incorporated herein by reference in its entirety.

BACKGROUND

I. Field

This disclosure relates to satellite based wireless communication systems, in particular, a receiver for receiving a signal using a tail-biting convolutional code for error correction, transmitted on a satellite link, such as the reverse link (uplink) to a geosynchronous (GEO) satellite.

II. Background

A user terminal communicates with a gateway through a GEO satellite. The reverse link signal from the user received by the satellite is relayed to and processed by the gateway on the ground. The reverse link signal for wireless communications typically consist of the pilot signal, traffic/data signal, and the overhead signals. The pilot signal provides a reference signal known to the receiver at the gateway demodulator and is used primarily for channel estimation. The traffic signal conveys the data packets from the user application. The overhead signals are used to indicate to the gateway the information necessary to operate the forward link and reverse link.

The propagation channel distorts the reverse link signal transmitted from the user terminal by inducing an amplitude attenuation and a phase-shift. In order to demodulate and decode the data channel carried by the reverse link signal, it is necessary to estimate the amplitude and phase-shift. This is accomplished by examining the distortion induced on the reference pilot signal and is known as channel estimation. Since the pilot signal is transmitted only for the purpose of the channel estimation and since it carries no data, it is desirable to minimize the pilot power overhead as far as possible.

Typically only the pilot signal is used to estimate the propagation channel's amplitude and phase-shift, and the data is demodulated and decoded from the traffic channel using the channel estimate obtained from the pilot signal. This requires that the pilot signal be sufficiently strong for reliable channel estimation, and thus translates to higher pilot overhead. In other words, a sufficient amount of power has to be allocated to the pilot signal. However, there is a limit on the total transmit power available to the user terminal. Therefore, there is a need to develop better demodulation techniques, which requires smaller pilot signal overhead, without sacrificing demodulation performance.

SUMMARY

Traditional error control techniques introduce some redundancy in the information sequence in a controlled manner such that the redundancy can be used at the receiver's decoder to overcome the effects of noise and interference encountered in the transmission channel, thus increasing the reliability of the received data.

In accordance with one aspect a communication signal is decoded. An initial channel estimate is established based on a pilot signal. Channel estimates associated with each state of a trellis are initialized to the initial channel estimate. Branch metrics between each pair of present states and next states in a stage of the trellis are computed based on a channel estimate associated with each present state of the trellis and data signals associated with the stage of the trellis. A winning state transition to each next state is selected based on the branch metrics and accumulated branch metrics for the present states. The channel estimates associated with each next state are updated based on data symbols associated with the winning transition to each next state, and the sequence is repeated incrementally for each stage of the trellis.

Various aspects and embodiments of the invention are described in further detail below.

BRIEF DESCRIPTION OF THE DRAWINGS

The features and nature of the present invention will become more apparent from the detailed description set forth below when taken in conjunction with the drawings in which like reference characters identify correspondingly throughout and wherein.

DETAILED DESCRIPTION

Various illustrative configurations are discussed in detail below. While specific steps, configurations, and arrangements are discussed, it should be understood that this is done for illustrative purposes only. A person skilled in the relevant art will recognize that other steps, configurations, and arrangements can be used without departing from the spirit and scope of the present invention.

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

Various attributes are believed to be important for commercially successful emergency phones service over a satellite link. For example, the service should be cost-effective and economical; the phones should be able to operate over terrestrial wireless networks in non-emergency situations; and the phones should be small, consistent with modern consumer expectations. This last requirement places severe restrictions on the engineering design of such a device, particularly with respect to its antenna and transmitter design. The desire for a compact, low-cost and easy-to-use device precludes complex antenna designs. Furthermore, the transmitter power is limited by regulatory requirements because the phone's transmitter is held close to the user's head. Additionally, since increased transmitter power directly reduces battery-life and stand-by time, it is clearly desirable to reduce transmitter power as far as possible without degrading link reliability.

One possibility for reducing the necessary transmitter power in the user terminal is to have a larger antenna or a more sensitive receiver in the GEO satellite. But this approach is expensive. A more cost-effective solution is to optimize the demodulator algorithms, thus reducing, as far as possible, the power needed for transmitting the "pilot" signal and the "data" signal. If necessary, the power saved can be expended on the "data" signal to increase reliability of the data transmission. In case the data signal is already sufficiently reliable, the power savings can be used to conserve battery-life.

The various demodulator algorithms should cope with channel uncertainty caused by, for example, channel time variations due to fading and interference. Even if the communication channel is quasi-static, the channel state is never known perfectly to the receiver because of residual errors from estimating the channel using the embedded pilot signal. The simplest way to reduce channel estimation error is to transmit a stronger pilot signal on the reverse link. But this approach is not always desirable because it requires either an increase in total transmitter power or, if total transmitter power is fixed, a corresponding reduction in the power of the other code multiplexed signals.

An alternate solution is to employ demodulator algorithms which can cope with partial channel uncertainty. By contrast, typical data demodulation algorithms pretend that there is no channel estimation error and this often inaccurate assumption leads to poor demodulator performance and poor link reliability, thus requiring greater transmit power from the user terminal.

A solution for the geosynchronous (GEO) satellite reverse link is to employ demodulator algorithms using variations of the maximum likelihood principle in the presence of partial channel uncertainty for demodulating and decoding the data channels. This can result in efficient and reliable communication over the satellite reverse link.

Motivation

It is desirable to design techniques to decode the traffic signal as efficiently as possible, especially in a satellite communication system. This minimizes the power required to be transmitted by the user terminal for the pilot signal and for the traffic signal when decoding a communication signal. The power savings can be used to increase the power expended on the traffic/data channel, allowing for more reliable data transmissions. A solution for the GEO satellite reverse link is to employ variations of the maximum likelihood principle in the presence of partial channel uncertainty, i.e., in situations when the channel estimate derived from the pilot signal may not be completely accurate. This can result in a power efficient technique to demodulate the traffic channels transmitted on the GEO satellite reverse link.

The Maximum Likelihood (ML) method assumes a known probability density function of the received signal (conditioned on the channel), and seeks to maximize the likelihood function (or the joint probability density function of the received signal) as a function of the channel parameters. The information sequence is selected that corresponds to the codeword with the best agreement to the detected sequence of received code symbols. A ML decoder deduces the codeword which is deemed "most likely" to lead to the received signal. The maximum likelihood decoding algorithm is computationally complex because the entire codeword space might be considered in the optimization process.

To improve the quality of demodulation in the reverse link, variations of maximum likelihood decoding in the presence of partial channel uncertainty are presented.

These methods are power-efficient and solve the problems of demodulation of the coded traffic/data signal of a GEO satellite reverse link. The first method is applicable to the data signal employing a convolutional code with one or more tailbits, and the second method is applicable to the data signal employing a convolutional code with no tailbits, i.e., a tailbiting (TB) convolutional code.

Power Limited Reverse Link

The transmitter power and the propagation path loss from the user terminal to the satellite determine the maximum signal strength received at the satellite. Then, given the noise sensitivity of the satellite and the demodulation/decoding algorithms at the gateway, the received signal strength determines whether reliable communication is possible. Therefore, the GEO satellite reverse link is "power limited", and hence, it is desirable to minimize the total received power required at the receiver for reliable communication. The total received power consists of the pilot, data and overhead channel power. If the signal attenuation and phase-shift from the propagation channel is perfectly known to the receiver, the minimum required received power of the data signal and that of the overhead signal are determined based on the spectral efficiencies and the selected error-correction codes for these channels. In practice, the propagation channel is not known, and it is necessary to employ the pilot signal to estimate it. Since the estimates are noisy, the required received power for the data and overhead signals will increase. The more the power allocated to the pilot, the smaller the increase in the required received data and overhead power. However, increasing the pilot power does not necessarily minimize the total received signal power required for reliable communication. Therefore, the pilot power should be optimized in such a way that the total received power is minimized. Notice that the "optimum" pilot power depends on the employed demodulation/decoding algorithm. Hence, the goal is to design a power efficient demodulation/decoding algorithm.

In a conventional coherent receiver used in a wireless communication system, in order to determine the information conveyed in the traffic channel, a conventional coherent receiver does the following:

1. Remove the channel induced phase ambiguity in the received data symbol using the channel estimate obtained from the pilot symbols, 2. Using the phase-corrected data symbols obtained from step 1, compute the branch metric for the decoder.

Maximum Likelihood Decoding

Maximum likelihood (ML) or complete decoding is typically used for error correction. The ML method assumes that the probability density function of the received signal (conditioned on the channel) is known, and seeks to maximize the likelihood function (or the joint probability density function of the received signal) as a function of the channel parameters. The information sequence is selected that corresponds to the sequence with the best agreement to the detected sequence of received code symbols.

The data symbol received and pilot symbol received are denoted by $x_l$ and $p_l$, respectively in the following equations:

$$x_l = e^{j\theta}\sqrt{E_t}a_l + w_{d,l} \qquad (1)$$

$$x_l = e^{j\theta}\sqrt{E_p} + w_{p,l} \qquad (2)$$

where
- l: the symbol index.
- $a_l$: the l-th modulation symbol transmitted in phase-shift keying (PSK) format.
- $\Theta$: the unknown phase caused by the propagation channel.
- $E_t$: the energy of a data symbol.
- $E_p$: the energy of a pilot symbol.
- $w_{d,l}$: the noise in the data symbol.
- $w_{p,l}$: the noise in the pilot symbol.

The following is assumed in (1) and (2):
Each branch in a trellis corresponds to L modulation symbols $a_l$.
There are K stages in the trellis.
So, N=KL modulation symbols $\{a_l\}_{l=1}^{N}$ are received.

The received data symbol $x_l$ and received pilot symbol $p_l$, are obtained after compensating for the timing offset and the frequency offset of the received signal. Typically, the timing offset and the frequency offset are estimated by the time tracking loop and the frequency tracking loop. The methods to update these loops will be discussed later.

Decoding using per-survivor processing is described in A. N. D'Andrea, U. Mengali and G. M. Vitetta, "Approximate ML decoding of coded PSK with no explicit carrier reference," IEEE Trans. Commun., vol. 42, pp. 1033-1039, February 1994. In the D'Andrea et al. paper, the data-aided decoding in the absence of the pilot channel is discussed. Here, the idea is generalized to the waveforms with the pilot channel. The sequences of $a_l$, $x_l$ and $p_l$ in (1) and (2) are represented by $$a=[a_1, \ldots, a_N] \quad x=[x_1, \ldots, x_N] \text{ and } p=[p_1, \ldots, p_N] \quad (3,4,5)$$

respectively. The probability density function (pdf) of x and p can be written as:

$$f(x, p \mid a, \theta) = \qquad (6)$$
$$C\exp\left(-\frac{\sum_{l=1}^{N}|p_l - e^{i\theta}\sqrt{E_t}a_l|^2}{2\sigma^2}\right)\exp\left(-\frac{\sum_{l=1}^{N}|p_l - e^{i\theta}\sqrt{E_p}|^2}{2\sigma^2}\right)$$

for some constant C. The ML estimate of a is obtained by maximizing $f(x, p|a, \theta)$ over all possible a and $\Theta$:

$$(a_{ML}, \theta_{ML}) = \underset{a,\theta}{\arg\max} f(x, p \mid a, \theta) \qquad (7)$$

One can show that the ML estimate of a is given by $$a_{ML} = \arg\max_{a}\left|\hat{p} + \frac{1}{N}\sqrt{\frac{E_t}{E_p}}\sum_{l=1}^{N}a_l^* x_l\right|^2 \qquad (8)$$

where $\hat{p}$ is an estimate of the channel induced uncertainty, $e^{i\Theta}$, obtained from the pilot signal $$\hat{p} \triangleq \frac{1}{N}\sum_{l=1}^{N}p_l \qquad (9)$$

Typically, only $\hat{p}$ is used to compute the bit log-likelihood ratios (LLRs) from the received data symbols $x_l$ which are fed to the decoder. The vectors of $a^{(k)}$, and $x^{(k)}$ for the k-th stage in the trellis (k≧1) are defined in the following equations:

$$a^{(k)} = [a_{(k-1)L+1}, a_{(k-1)L+2}, \ldots, a_{kL}] \qquad (10)$$

$$a_k = [a^{(1)}, a^{(2)}, \ldots, a^{(k)}] \qquad (11)$$

$$x^{(k)} = [x_{(k-1)L+1}, x_{(k-1)L+2}, \ldots, x_{kL}] \qquad (12)$$

$$x_k = [x^{(1)}, x^{(2)}, x^{(k)}] \qquad (13)$$

In terms of these definitions, one can show that the ML estimate $\hat{a}_{ML}$ is found from $$a_{ML} = \qquad (14)$$
$$\underset{a}{\arg\max}\left[2\operatorname{Re}\left\{\sum_{k=1}^{K}S^*(a_{k-1})a^{(k)H}x^{(k)}\right\} + \frac{1}{N}\sqrt{\frac{E_t}{E_p}}\sum_{k=1}^{K}|a^{(k)H}x^{(k)}|^2\right]$$

where $$S(a_0) \triangleq \beta\hat{p} \qquad (15)$$

Where $\beta$ is a suitably selected scale factor and for k≧1, $$S(a_k) \triangleq \beta\hat{p} + \frac{1}{N}\sqrt{\frac{E_t}{E_p}}a_k^H x_k \qquad (16)$$

Notice that to maximize the bracketed quantity in (14), it is not sufficient to maximize independently each term in the sum, because there is dependence across different terms in the sum. For this reason, Viterbi algorithm cannot be directly applied to (14).

Data-Aided Decoding

In data-aided (DA) decoding, data itself aids in decoding, hence the name. Unlike the work in A. N. D'Andrea, U. Mengali and G. M. Vitetta, "Approximate ML decoding of coded PSK with no explicit carrier reference," IEEE Trans. Commun., vol. 42, pp. 1033-1039, February 1994, the channel estimate derived from the pilot is also optimally used along with the data symbols associated with the survivor path (the most likely path to a given state), as the decoding progresses in the trellis. (See the algorithm below.)

The branch metric to be used with Viterbi algorithm to find an approximate answer to (14) is presented below.

Notation

Suppose that $a_l$ is a modulation symbol. Then,
$\hat{a}_l$ is the corresponding symbol on a survivor path.
$\tilde{a}_l$ is the corresponding trial symbol/label associated with a branch.

The vectors of $\hat{a}_l$, and $\tilde{a}_l$ for the k-th stage are defined in the trellis (k≧1):

$$\hat{a}^{(k)} = [\hat{a}_{(k-1)L+1}, \hat{a}_{(k-1)L+2}, \ldots, \hat{a}_{kL}] \qquad (17)$$

$$\hat{a}_k = [\hat{a}^{(1)}, \hat{a}^{(2)}, \ldots, \hat{a}^{(k)}] \qquad (18)$$

$$\tilde{a}^{(k)} = [\tilde{a}_{(k-1)L+1}, \tilde{a}_{(k-1)L+2}, \ldots, \tilde{a}_{kL}] \qquad (19)$$

Branch Metric

At the k-th stage of the trellis, for each state s, a survivor path is found to this state s. Suppose that $\hat{a}_k$ contains all the symbols on this survivor path. Then, a value $S_k(s)$ is computed, $$S_k(s) = \beta\hat{p} + \frac{1}{N}\sqrt{\frac{E_t}{E_p}}\hat{a}_k^H x_k \quad (20)$$

It plays the role of a channel estimate during the (k+1)-th stage for the branches that leave the state s, and the branch metrics are computed by:

$$\text{Re}[S_k^*(s)\hat{a}^{(k+1)H}x^{(k+1)}] \quad (21)$$

The value $S_k(s)$ can be computed recursively. In a practical modem implementation, some modification would be made to $S_k(S)$ in order to ensure that $S_k(s)$ can be represented with a small number of bits.

In the following, the algorithm for the branch metric computation is summarized.

Branch Metric Computation for Viterbi Algorithm

Recall that there are K decoding stages in the trellis.

(Step 1)

At the first stage (k=1), initialize the channel estimate at each state s to that from the pilot, wherein each state s corresponds to, $$S_0(s) = \beta\hat{p} \quad (22)$$

This is one key difference from the work described in D'Andrea et al.; the channel estimate is initialized with the estimate derived from the pilot channel.

(Step 2)

At the k-th stage, compute the branch metrics for the transitions from each state s:

$$\text{Re}[S_k^*(s)\hat{a}^{(k)H}x^{(k)}] \quad (23)$$

If a path from the state s survives at the state s', update the data-aided channel estimate at the state s' by $$S_k(s') = (1-\lambda)S_{k-1}(s) + \frac{\lambda}{N}\sqrt{\frac{E_t}{E_p}}\hat{a}^{(k)H}x(k) \quad (24)$$

where the modulation symbols $\hat{a}^{(k)}$ corresponds to the symbols on the survivor path from the state s to s'. $\lambda$ is a forgetting factor that satisfies $0 \leq \lambda \leq 1$. Notice that the second term on the right side of (24) includes a scale factor depending on the ratio of the traffic signal power to the pilot signal power. This term optimally weights the contribution to the channel estimate derived from the pilot signal, against the contribution derived from the survivor path. The presence of this term and the optimal weighting is another key difference from the work described in D'Andrea et al.

(Step 3)

If $k \leq K-1$, increment k, and go to Step 2. If k=K, stop.

The branch metric computation algorithm can be applied to a Viterbi decoding of convolutional codes without modification.

Functional Operation

Figure 1:
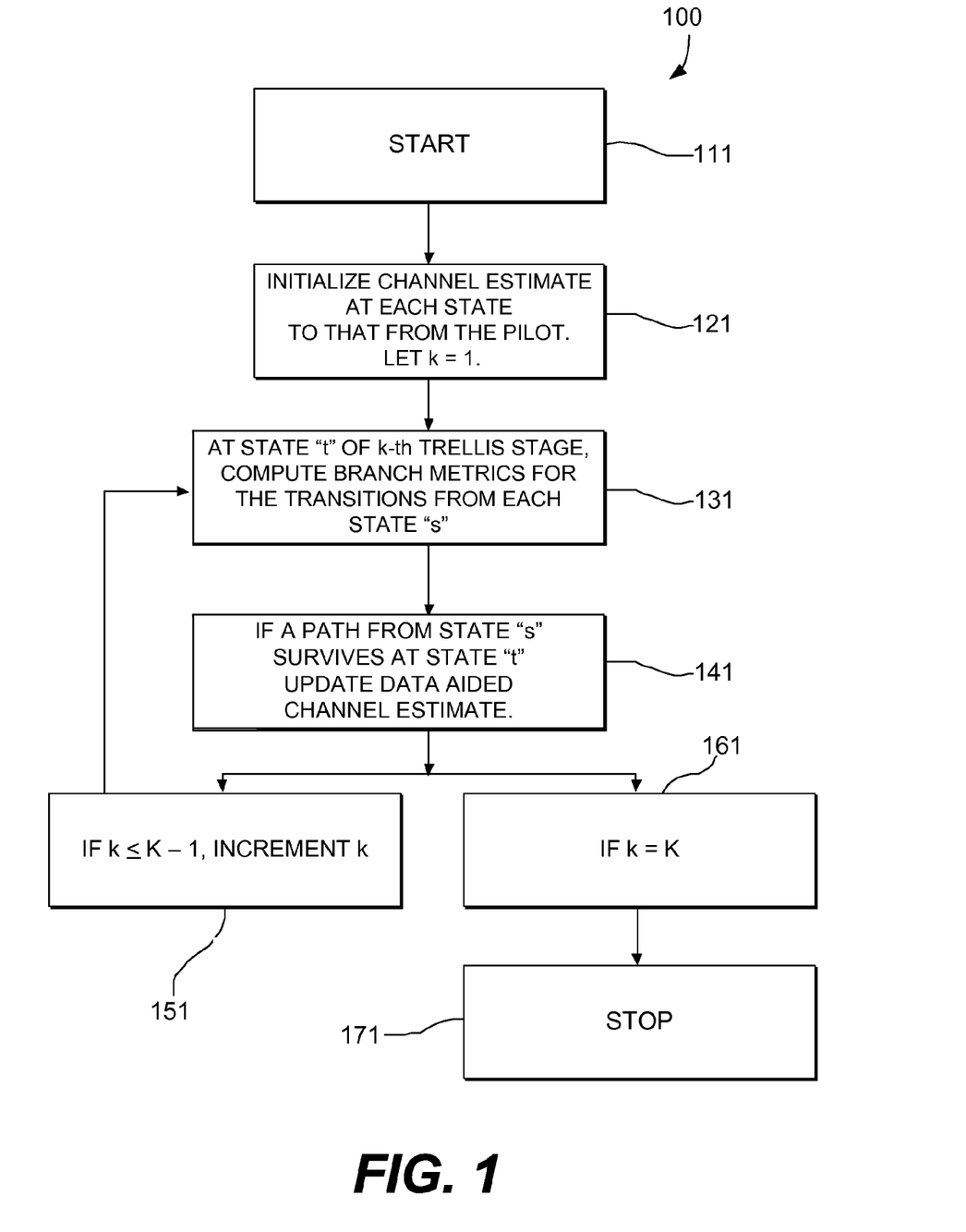
FIG. 1 is a flow diagram showing the functional operation of a receiver for the GEO satellite reverse link using branch metrics.

FIG. 1 is a flow diagram 100 showing the functional operation of a receiver for the GEO satellite reverse link using branch metrics implementing a regular convolutional code. The channel estimate is initialized with that from the pilot (steps 111 and 121). At a state t, branch metrics are computed (step 131) for the transitions from each state to this state. If a path from one state survives, the data aided channel estimate is updated for the state t, using the modulation symbols corresponding to the surviving path, and the data aided channel estimate of the state from which the surviving path originates. (step 141). Steps 131 and 141 are repeated for all the states t of the k-th trellis stage. If $k \leq K-1$, k is incremented (step 151) and the process is looped by going back to the step 131. If k=K, the decoding is completed (steps 161 and 171).

In the following, the application of this algorithm to the decoding of tail-biting (TB) convolutional codes is discussed.

Branch Metric Computation for Wrap-Around Viterbi Algorithm

An excellent decoding algorithm for a TB convolutional code is the Wrap-Around Viterbi algorithm (WAVA). See R. Y. Shao, S. Lin and M. P. C. Fossorier, "Two decoding algorithms for tailbiting codes," *IEEE Trans. Communications*, vol. 51, pp. 1658-1665, October 2003 ("Shao et al."). The branch metric provided in Shao et al. can be computed only if the channel is perfectly known. If the channel is perfectly known, the branch metric is accumulated throughout the circular decoding. See Shao et al. But if the channel is not perfectly known, and if data-aided channel estimation were adopted as a result and applied to the branch metric computation as in (23), it is not clear how to update $S_k(s)$ between different iterations.

The idea of circular decoding can be justified by the following argument. Suppose that the received sequence of encoded communication data is extended by repeating it. Assume also that the noise components are independent across the repeated extensions. Then, it becomes natural to determine the survivor path based on the metrics accumulated throughout the circular decoding. Now, if this trick is applied to the data-aided decoding, one will realize that the $S_k(s)$ should be accumulated from iteration to iteration.

In summary, throughout the circular decoding, as well as applying the branch metric as in (23), $S_k(s)$ is accumulated as in (24). The circular decoding is achieved by extending a received sequence by repeating the received sequence. In other words, (22) is performed only once, at the beginning of the first iteration. It has been observed from simulations that performance degrades if (22) is applied after each pass through the trellis.

For WAVA, Step 3 in the DA decoding section above is replaced by the following:

(Step 3')

The k-th stage is compared to the predetermined value K.

If $k \leq K-1$, increment k, and go to Step 2.

If k=K and if the current iteration is not the last iteration, then for each state s, let $$S_0(s) = S_K(s); \quad (25)$$

Also set k=1, and go to Step 2 for the next iteration of the decoding.

Figure 2:
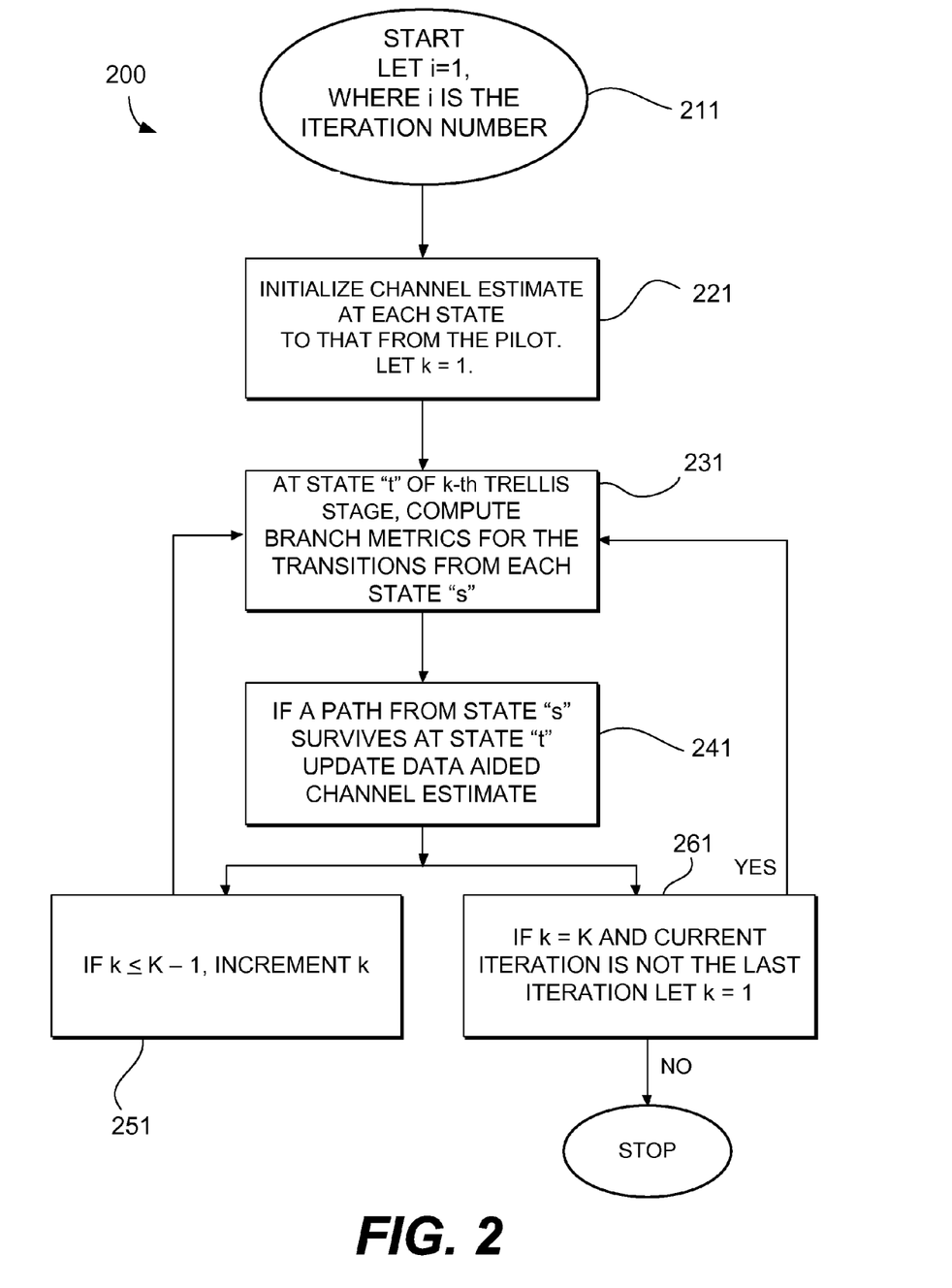
FIG. 2 is a flow diagram showing the functional operation of a receiver for the GEO satellite reverse link using partial tail-biting code.

FIG. 2 is a flow diagram 200 showing the functional operation of a receiver for the GEO satellite reverse link using data-aided branch metrics, and implementing a tail-biting convolutional code. The channel estimate is initialized with estimates made from the pilot (steps 211 and 221). At a state t, branch metrics are computed (step 231) for the transitions from each state to this state. If a path from one state survives, the data-aided channel estimate is updated for the state t, using the modulation symbols corresponding to the surviving path, and the data aided channel estimate of the state from which the surviving path originates (step 241). If $k \leq K-1$, k is incremented (step 251) and the process is looped back to (step 231). (231) and (241) are repeated for all the states of the k-th trellis stage. If k=K, and if the current iteration i is not the last iteration, let k=1 and i=i+1 (step 261), and the process is looped back to step 231.

Figure 3:
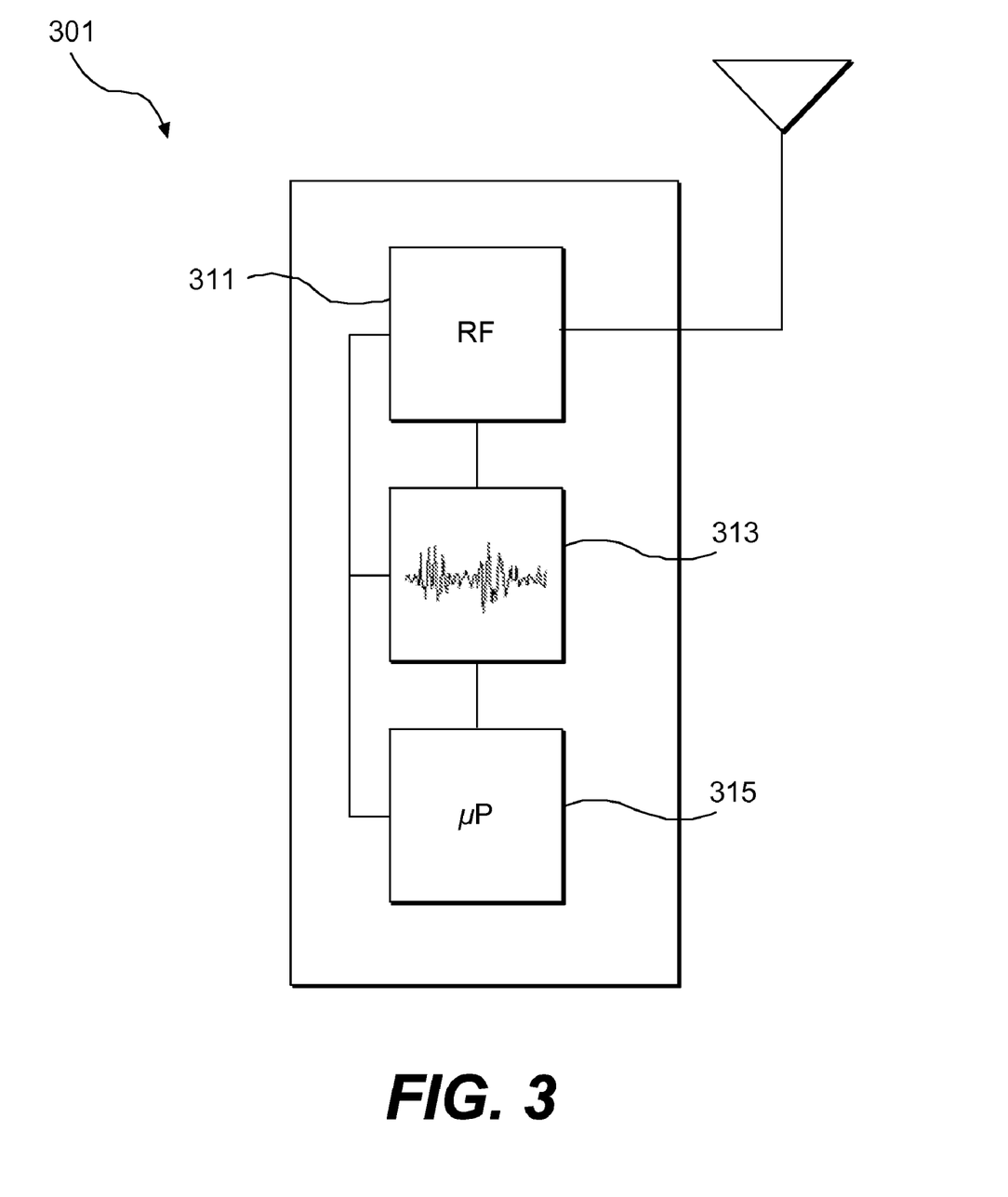
FIG. 3 is a schematic block diagram of a wireless communication device (WCD) n.

FIG. 3 is a schematic block diagram of a wireless communication device (WCD) 301 in which traffic signals are decoded. The operation is implemented at the gateway, but the WCD (301) is a mobile terminal that sends the traffic and pilot signal to the satellite. The WCD can be configured to transmit a small amount of power for the pilot signal, but it is desired that the gateway receiver to reliably decode the data signal.

The WCD 301 includes an RF circuit 311, for communicating with the satellite, and processing circuitry 313 for processing the communications. By way of example, processing circuitry can include spreaders, despreaders and related logic. The WCD 301 includes a processor 315 that performs control functions, although in many cases the processor 315 is integrated with the processing circuitry 313 and may be further integrated with the RF circuit 311.

The processor 315 is able to enhance broadband communication and includes an initial channel estimation circuit for establishing an initial channel estimate, a finite state machine capable of resolving a plurality of states, and a channel estimation circuit capable of updating the data aided channel estimate. The machine provides an output of computed branch metrics for transitions from each state at the end stage.

The processor 315 may be a monolithic integrated circuit (IC) chip, or a chipset comprising multiple integrated circuit chips.

Simulation Results for Proposed Algorithm for TB convolutional code

Figure 4:
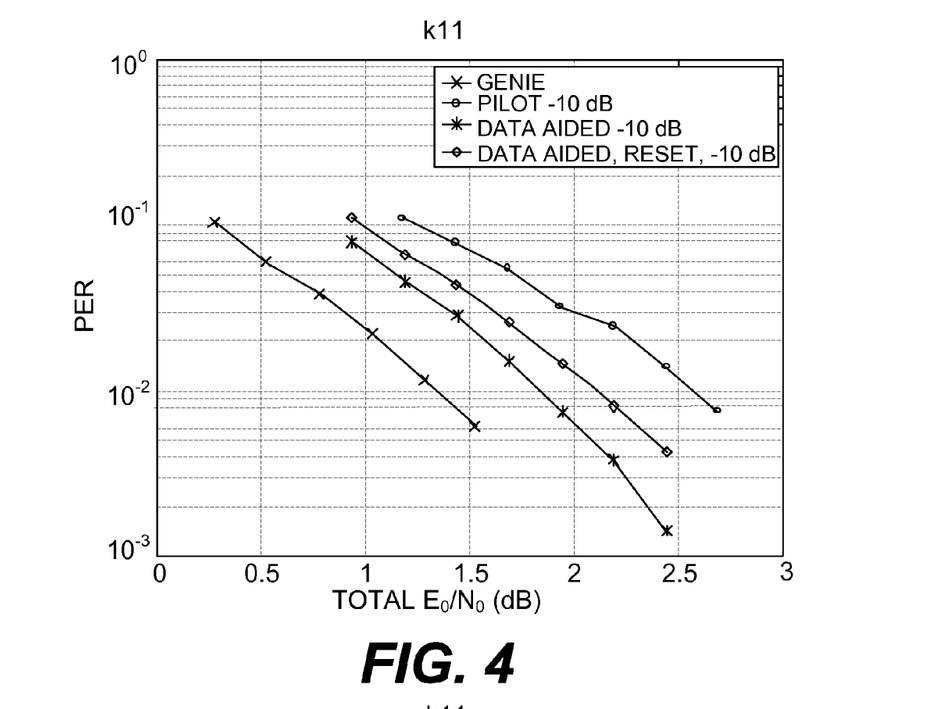
FIG. 4 illustrates an example of r=¼, constraint length=11, $I_{max}=3$, 48 information bits (K=48, L=4, N=192), $E_p/E_d=-10$ dB.
Figure 5:
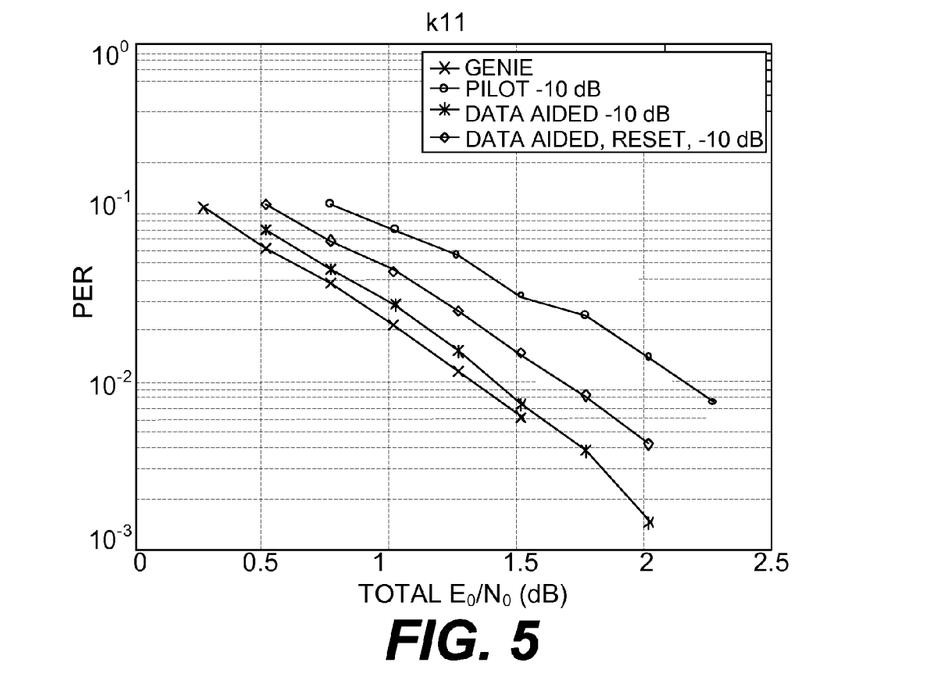
FIG. 5 illustrates an example of r=¼, constraint length=11, $I_{max}=3$, 48 information bits (K=48, L=4, N=192), $E_p/E_d=-10$ dB.

FIGS. 4 and 5 illustrate an example of a tailbiting convolutional code with rate r=¼, constraint length=11, and a packet size of 48 information bits. Here, K=48, L=4, N=192. The pilot-to-traffic power ratio $E_p/E_t$=−10 dB and three circular decoding iterations are employed in accordance with one example embodiment.

In FIG. 4 and FIG. 5, "Data-aided" shows the performance of the proposed algorithm, and "Data-aided, Reset" shows the performance of the algorithm that performs (22) at the beginning of each iteration.

FIG. 4 demonstrates the performance gain of the proposed algorithm. Approximately 0.75 dB gain in total $E_b/N_o$ is achieved with respect to the conventional receiver that uses only the pilot channel for demodulation. By ignoring the pilot overhead in computing $E_b/N_o$, one can quantify channel estimation loss for each scheme. The results are shown in FIG. 5. It is observed that the loss of the proposed scheme shown to be approximately 0.1 dB.

Data-Aided Decoding with Partial Tail-Biting (PTB).

The data-aided decoding technique described here can also be applied to a convolutional code with "partial tail-biting". For example, suppose that there are K information bits to be transmitted in a physical layer packet. If the encoder has Q memory elements, then traditional convolutional coding with a zero-tail adds Q zeros to the packet, before the packet of length K+Q is encoded. The Q zeros are referred to as tail bits. When the enlarged packet of length K+Q is encoded starting from the zero-state, the Q tail bits force the encoder into a known end state (i.e., the zero-state) at the end of the encoding. The fact that both the start/end states are known to the decoder can be exploited by the decoding algorithm.

An alternate encoding approach is "tail-biting encoding". Here, it is recognized that when no tail-bits are added to the packet, the encoder end-state is entirely determined by the last Q bits of the packet. This end-state is also selected as the encoder start-state, and the packet of length K is accordingly encoded. With tail-biting encoding, the decoder does not have complete information about the start/end states of the encoder. It only knows that the start-state and end-state are identical. However, there may be as many as $2^Q$ start/end states with a binary convolutional code. The WAVA decoding algorithm enforces the constraint that the start/end states are identical.

A further generalization of tail-biting encoding is "partial tail-biting". Here, Z zeros are added to the end of the packet (where 0<Z<Q), and the last Q bits of the enlarged packet of length K+Z are used to determine the end-state of the encoder. This end-state is used as the start-state of the encoder, and the packet of length K+Z is encoded. It is seen that there may be as many as $2^{Q-Z}$ start/end states with a binary convolutional code, but as in the tail-biting case, the start/end states coincide. The data-aided WAVA decoding algorithm can be modified to handle this "partial tail-biting generalization". The main adjustments to the data-aided WAVA algorithm are twofold. At the beginning of the first iteration through the trellis, the starting state metrics are initialized to reflect the fact that certain start-states are invalid. The invalid start-states are those which do not have Z zeros in their state description. As an example, the valid start-states can have their starting state metrics initialized to zero. The invalid start-states can have their starting state metrics initialized to either a negative number with very large absolute value (if the decoder is written to maximize the accumulated metric), or a positive number with very large absolute number (if the decoder is written to minimize the accumulated metric). The second adjustment is to recognize that certain bits in the end of the packet are predetermined, and to reflect this fact in the computation of branch metrics at those stages in the trellis.

Figure 6:
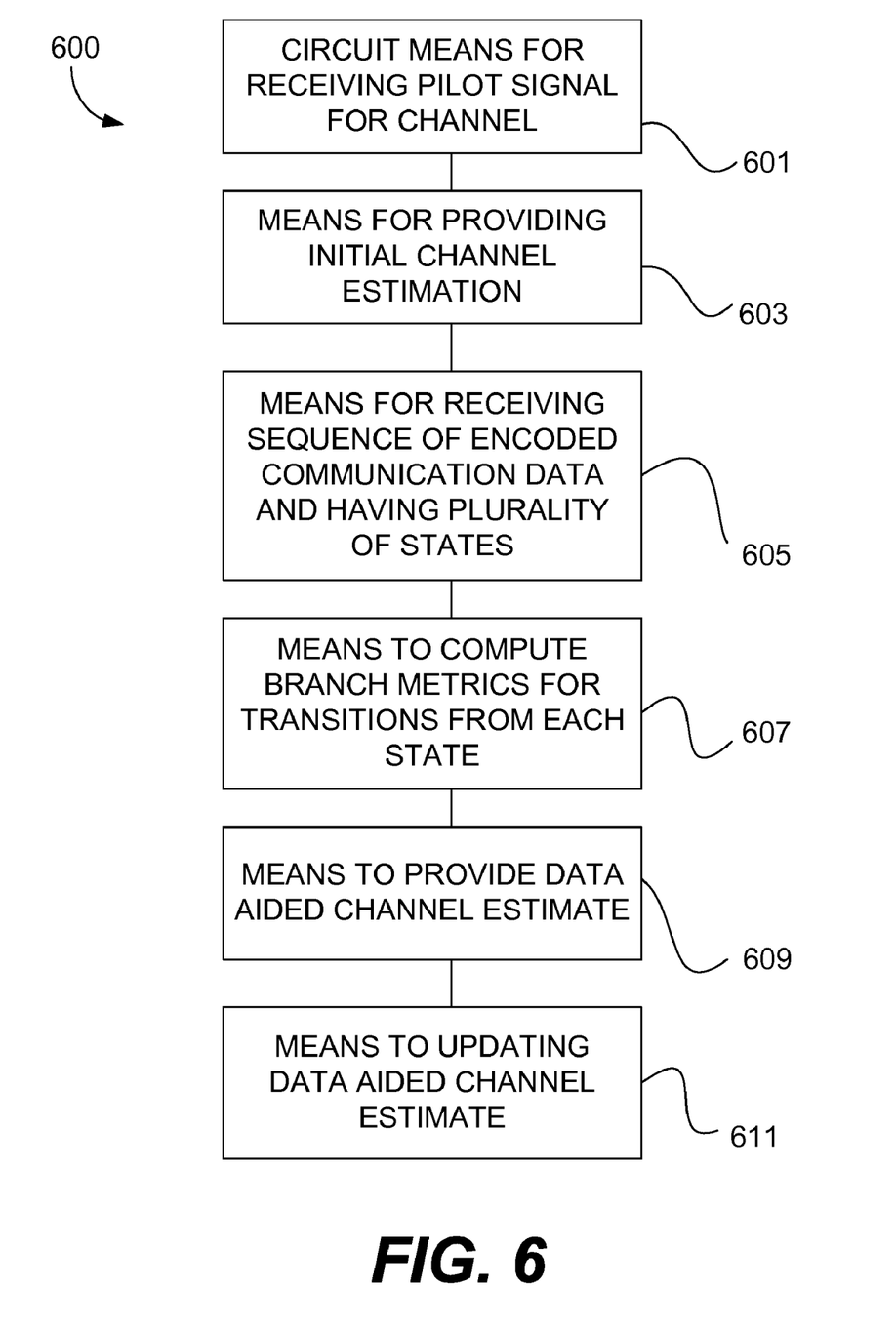
FIG. 6 is a diagram illustrating an example of a wireless communication system.

FIG. 6 is a diagram illustrating an example of a wireless communication system 600. Circuit means 601 are provided for receiving a pilot signal. The circuit means 601 are connected to means 603 for providing initial channel estimation. Means 603 are connected to means 605 for receiving a sequence of encoded communication data in a communication channel and having a plurality of states. Means 605 are connected to means 607 to compute branch metrics for transitions from each state to predetermined end states. Means 607 are connected to means to provide a data aided channel estimate based on the computed branch metrics. Updating means 611 updates the data aided channel estimate if a path from the state survives at the predetermined end state. The means 603 for providing initial channel estimation provides the initial channel estimation based, at least in part, on a pilot signal. The means 609 to provide a data aided channel estimate includes means to initialize the channel estimates of each state to the channel estimate from the pilot channel p̂, i.e., the channel estimate at each state s initialized to $S_0(s)$=p̂, and to update the channel estimate at a predetermined end state based on the surviving path to the predetermined end state. The means 607 to compute branch metric provides the branch metric for transition from each state s to the predetermined end states of the k-th trellis stage, by using the trial modulation symbols on the branch, and the data aided channel estimate at the state s. The means 607 repeats the computation of branch metrics for the transitions from each state.

Those skilled in the art will appreciate that the various illustrative logical blocks, modules, circuits, and algorithms described in connection with the embodiments disclosed herein may be implemented as electronic hardware, computer software, or combinations of both. To clearly illustrate this interchangeability of hardware and software, various illustrative components, blocks, modules, circuits, and algorithms have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, microprocessor, or state machine. A processor may also be implemented as a combination of computing devices, e.g., a combination of a DSP and a microprocessor, a plurality of microprocessors, one or more microprocessors in conjunction with a DSP core, or any other such configuration.

The methods or algorithms described in connection with the embodiments disclosed herein may be embodied directly in hardware, in a software module executed by a microprocessor, or in a combination of the two. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. For example, one or more elements can be rearranged and/or combined, or additional elements may be added. Thus, the present invention is not intended to be limited to the embodiments shown herein but is to be accorded the widest scope consistent with the principles and novel features disclosed herein.

The techniques and modules described herein may be implemented by various means. For example, these techniques may be implemented in hardware, software, or a combination thereof. For a hardware implementation, the processing units within an access point or an access terminal may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a combination thereof.

For a software implementation, the techniques described herein may be implemented with modules (e.g., procedures, functions, and so on) that perform the functions described herein. The software codes may be stored in memory units and executed by processors or demodulators. The memory unit may be implemented within the processor or external to the processor, in which case it can be communicatively coupled to the processor via various means.

The previous description of the disclosed embodiments is provided to enable any person skilled in the art to make or use the features, functions, operations, and embodiments disclosed herein. Various modifications to these embodiments may be readily apparent to those skilled in the art, and the generic principles defined herein may be applied to other embodiments without departing from their spirit or scope. Thus, the present disclosure is not intended to be limited to the embodiments shown herein but is to be accorded the widest scope consistent with the principles and novel features disclosed herein.

What is claimed is:

1. A method for decoding a communication signal in a wireless communication system, the method comprising:
    (a) using an antenna for receiving a pilot signal;
    (b) establishing an initial channel estimate based on the pilot signal;
    (c) initializing channel estimates associated with each state of a trellis to the initial channel estimate;
    (d) computing branch metrics between each pair of present states and next states in a stage of the trellis based on a channel estimate associated with each present state of the trellis and data signals associated with the stage of the trellis;
    (e) selecting a winning state transition to each next state based on the branch metrics and accumulated branch metrics for the present states; and
    (f) updating the channel estimates associated with each next state based on data symbols associated with the winning transition to each next state; and
    (g) repeating steps (d), (e) and (f) for each stage of the trellis; and wherein updating the channel estimates comprises multiplying by an energy ratio of a traffic signal energy to a pilot signal energy.

2. The method of claim 1, wherein step (f) further comprises:
    multiplying the energy ratio by a sum of products of the data signals and symbols on a path from the present states to the next states.

3. The method of claim 2, wherein step (f) further comprises:
    multiplying by a decay factor associated with a number of stages in the trellis.

4. The method of claim 1, wherein step (d) comprises:
    computing the branch metrics based on a product of the data signals and symbols on a path from the present states to the next states.

5. The method of claim 1, wherein performing steps (d), (e), (f) and (g) comprises performing one iteration through the trellis, the method further comprising:
    performing circular decoding by extending a received sequence by repeating the received sequence; and
    repeating performing iterations through the trellis.

6. The method of claim 1, further comprising:
    setting a number Z of initial state metrics of a decoder to a first value; and
    setting a second number Y of initial state metrics of the decoder to a second value.

7. The method of claim 1, further comprising:
    setting a number Z of initial state metrics of a decoder to a first value, said first value less than a number of memory states in the decoder; and
    setting a second number Y of initial state metrics of the decoder to a second value.

8. A wireless communication system comprising:
means for receiving a pilot signal;
means for establishing an initial channel estimate based on the pilot signal;
means for initializing channel estimates associated with each state of a trellis to the initial channel estimate;
means for computing branch metrics between each pair of present states and next states in a stage of the trellis based on a channel estimate associated with each present state of the trellis and data signals associated with the stage of the trellis;
means for selecting a winning state transition to each next state based on the branch metrics and accumulated branch metrics for the present states; and
means for updating the channel estimates associated with each next state based on data symbols associated with the winning transition to each next states; and
means for repeatedly enabling the means for computing branch metrics, the means for selecting a winning state transition and the means for updating the channel estimates for each stage of the trellis; and wherein the means for updating the channel estimates for each stage of the trellis comprises means for multiplying by an energy ratio of a traffic signal energy to a pilot signal energy.

9. The wireless communication system of claim 8, wherein the means for the sequence of computing branch metrics, selecting a winning state transition and updating the channel estimates comprises means for performing one iteration through the trellis, further comprising:
means for performing circular decoding by extending a received sequence by repeating the received sequence; and
means for repeating performing iterations through the trellis.

10. The wireless communication system of claim 8, further comprising:
means for setting a number Z of initial state metrics of a decoder to a first value; and
means for setting a second number Y of initial state metrics of the decoder to a second value.

11. The wireless communication system of claim 8, further comprising:
finite state machine circuit means for setting a number Z of initial state metrics of a decoder to a first value, said first value less than a number of memory states in the decoder; and
finite state machine circuit means for setting a second number Y of initial state metrics of the decoder to a second value.

12. The wireless communication system of claim 8, wherein the means for establishing the initial channel estimate provides the initial channel estimate based at least in part on a reduced power pilot signal.

13. An apparatus for enhancing aeronautical broadband communication, the apparatus comprising:
a processor coupled to a memory for storing instructions therein, the processor configured to execute the instructions to:
(a) obtain a received pilot signal;
(b) establish an initial channel estimate based on the pilot signal;
(c) initialize channel estimates associated with each state of a trellis to the initial channel estimate;
(d) compute branch metrics between each pair of present states and next states in a stage of the trellis based on a channel estimate associated with each present state of the trellis and data signals associated with the stage of the trellis;
(e) select a winning state transition to each next state based on the branch metrics and accumulated branch metrics for the present states; and
(f) update the channel estimates associated with each next state based on data symbols associated with the winning transition to each next state; and
(g) repeat steps (d), (e) and (f) for each stage of the trellis; and wherein the processor is further configured to multiply by an energy ratio of a traffic signal energy to a pilot signal energy as part of step (f).

14. The apparatus of claim 13, wherein the processor is further configured to:
perform one iteration through the trellis, so as to perform circular decoding by extending a received sequence by repeating the received sequence so that the repetition results in performing iterations through the trellis.

15. The apparatus of claim 13, wherein the processor is further configured to:
set a number Z of initial state metrics of a decoder to a first value; and
set a second number Y of initial state metrics of the decoder to a second value.

16. The apparatus of claim 13, wherein the processor is further configured to:
set a number Z of initial state metrics of a decoder to a first value, said first value less than a number of memory states in the decoder; and
set a second number Y of initial state metrics of the decoder to a second value.

17. The apparatus of claim 13, wherein the processor is a chipset including at least one monolithic integrated circuit.

18. A computer program product, comprising: a non-transitory computer-readable medium encoded with a computer program, the non-transitory computer-readable medium comprising:
a first instruction for causing a computer to establish an initial channel estimate based on a pilot signal;
a second instruction for causing a computer to initialize channel estimates associated with each state of a trellis to the initial channel estimate;
a third instruction for causing the computer to compute branch metrics between each pair of present states and next states in a stage of the trellis based on a channel estimate associated with each present state of the trellis and data signals associated with the stage of the trellis;
a fourth instruction for causing the computer to select a winning state transition to each next state based on the branch metrics and accumulated branch metrics for the present states; and
a fifth instruction for causing the computer to update the channel estimates associated with each next state based on data symbols associated with the winning transition to each next state, wherein the fifth instruction further comprises instructions for causing the computer to multiply by an energy ratio of a traffic signal energy to a pilot signal energy; and
a sixth instruction for causing the computer to repeat the sequence of computing branch metrics, selecting a winning state transition and updating the channel estimates for each stage of the trellis.

* * * * *